(12) United States Patent
Han et al.

(10) Patent No.: US 12,719,411 B2
(45) Date of Patent: Aug. 25, 2026

(54) HIGH SPEED AMPLIFIER CIRCUIT

(71) Applicant: IUCF-HYU (INDUSTRY-UNIVERSITY COOPERATION FOUNDATION HANYANG UNIVERSITY), Seoul (KR)

(72) Inventors: Jaeduk Han, Seoul (KR); Sangwan Lee, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 415 days.

(21) Appl. No.: 18/410,427

(22) Filed: Jan. 11, 2024

(65) Prior Publication Data

US 2024/0250642 A1 Jul. 25, 2024

(30) Foreign Application Priority Data

Jan. 13, 2023 (KR) ........................ 10-2023-0005221
Jan. 8, 2024 (KR) ........................ 10-2024-0003149

(51) Int. Cl.
*H03F 3/45* (2006.01)
*H03F 1/02* (2006.01)
(Continued)

(52) U.S. Cl.
CPC ......... *H03F 1/0216* (2013.01); *H03F 1/3211* (2013.01); *H03F 3/45475* (2013.01); *H04L 25/0272* (2013.01); *H04L 25/03878* (2013.01)

(58) Field of Classification Search
CPC ................. H03F 3/45; H03F 1/02; H03F 1/07
(Continued)

(56) References Cited

U.S. PATENT DOCUMENTS 4,918,398 A 4/1990 Huijsing et al.
9,806,915 B1 10/2017 Elzeftawi et al.
(Continued)

FOREIGN PATENT DOCUMENTS

KR 10-0135971 B1 5/1998
KR 10-2004-0045428 A 6/2004
(Continued)

OTHER PUBLICATIONS

Korean Office Action dated Jun. 27, 2025, issued in Korean application No. 10-2024-0003149.

*Primary Examiner* — Henry Choe
(74) *Attorney, Agent, or Firm* — Sughrue Mion, PLLC

(57) ABSTRACT

A high-speed amplifier circuit may include a first bias conversion circuit configured to perform a level-down operation on an input positive differential signal, a second bias conversion circuit configured to perform a level-up operation on an input negative differential signal, a first transmission circuit electrically connected to the first bias conversion circuit and configured to output a first differential signal having a voltage of a level within a first range among all levels, based on the positive differential signal on which the level-down operation has been performed, and a second transmission circuit electrically connected to the second bias conversion circuit and configured to output a second differential signal having a voltage of a level within a second range among all the levels, based on the negative differential signal on which the level-up operation has been performed.

17 Claims, 17 Drawing Sheets

(51) Int. Cl.

| | |
|---|---|
| ***H03F 1/32*** | (2006.01) |
| ***H04L 25/02*** | (2006.01) |
| ***H04L 25/03*** | (2006.01) |

(58) Field of Classification Search
USPC .................................... 330/252, 124 R, 295
See application file for complete search history.

(56) References Cited

U.S. PATENT DOCUMENTS

| | | | |
|---|---|---|---|
| 11,398,934 | B1 | 7/2022 | Casey et al. |
| 2003/0045264 | A1 | 3/2003 | Jeong et al. |
| 2010/0322346 | A1 | 12/2010 | Aparin |
| 2012/0086507 | A1 | 4/2012 | Kim et al. |
| 2019/0312759 | A1 | 10/2019 | Chen et al. |

FOREIGN PATENT DOCUMENTS

| | | | |
|---|---|---|---|
| KR | 10-2012-0034209 | A | 4/2012 |
| KR | 10-1128487 | B1 | 6/2012 |

HIGH SPEED AMPLIFIER CIRCUIT

CROSS-REFERENCE TO RELATED APPLICATION

This application is based on and claims priority under 35 U.S.C. § 119 to Korean Patent Application No. 10-2023-0005221, filed on Jan. 13, 2023, and 10-2024-0003149, filed on Jan. 8, 2024, in the Korean Intellectual Property Office, the disclosures of which are incorporated by reference herein in their entirety.

BACKGROUND

1. Field

The disclosure relates to a high-speed amplifier circuit, and more particularly, to a high-speed amplifier circuit capable of achieving high linearity even when a size of an input voltage swing increases by performing level conversion on a differential signal input to the high-speed amplifier circuit and then applying level-converted signals to a system in parallel. This research was conducted with the support of the Samsung Future Technology Promotion Project (Project number: SRFC-IT2001-02).

2. Description of the Related Art

As the processing power of digital computing engines has improved and technologies using interconnected networks have been developed, ultra-high-speed, large-volume data transfer technology has been required, and high-speed serial link circuit structures have been used for this purpose.

In order to increase the data rate of communication systems under finite channel bandwidth conditions, in addition to the existing method of transmitting 1 bit per symbol, called non-return-to-zero (NRZ), with technological advancements, N-level pulse amplitude modulation (PAM-N) technology capable of transmitting 2 or more bits of signal instead of 1 bit at once, has been applied to increase the signal transmission efficiency in signal processing fields that require high-speed operation, such as ultra-high-speed wired/wireless communication integrated circuits (ICs), communication interfaces of processing units such as a central processing unit (CPU)/a graphics processing unit (GPU), and memory-CPU communication interfaces.

Furthermore, in this signal processing method, a differential pair channel structure using a difference between two signals as an input for noise cancellation is used.

For any system using a differential input, ensuring linearity is a major challenge. When an input signal is fed with a magnitude outside a linear range of a system, compression of the signal occurs in a corresponding portion of the system, which is a direct cause of error occurrence.

Additionally, because maximum linearity also decreases according to the size of a device being smaller, it is more difficult to satisfy high linearity for a high input swing.

Therefore, in the case of scaling down devices for high data rates and using a differential input system for noise cancellation, ensuring high linearity when using higher-order PAM modulation for transmitting more information without increasing a symbol rate is an important issue.

SUMMARY

According to an embodiment, a high-speed amplifier capable of ensuring high linearity even when a size of an input voltage swing increases is provided.

Additional aspects will be set forth in part in the description which follows and, in part, will be apparent from the description, or may be learned by practice of the presented embodiments of the disclosure.

A high-speed amplifier circuit according to an embodiment may include a first bias conversion circuit configured to perform a level-down operation on an input positive differential signal, a second bias conversion circuit configured to perform a level-up operation on an input negative differential signal, a first transmission circuit electrically connected to the first bias conversion circuit and configured to output a first differential signal having a voltage of a level within a first range among all levels, based on the positive differential signal on which the level-down operation has been performed, and a second transmission circuit electrically connected to the second bias conversion circuit and configured to output a second differential signal having a voltage of a level within a second range among all the levels, based on the negative differential signal on which the level-up operation has been performed.

According to an embodiment, in the high-speed amplifier circuit, the first transmission circuit may include a continuous-time linear equalizer (CTLE) configured to output the first differential signal by filtering out inter-symbol interference (ISI) from the positive differential signal on which the level-down operation has been performed, and the second transmission circuit may include a CTLE configured to output the second differential signal by filtering out ISI from the negative differential signal on which the level-up operation has been performed.

According to an embodiment, in the high-speed amplifier circuit, the first transmission circuit may include an amplifier circuit configured to amplify the positive differential signal on which the level-down operation has been performed and output the first differential signal, and the second transmission circuit may include an amplifier circuit configured to amplify the negative differential signal on which the level-up operation has been performed and output the second differential signal.

According to an embodiment, the high-speed amplifier circuit may further include at least one first slicer configured to determine a level of the output first differential signal, and at least one second slicer configured to determine a level of the output second differential signal.

According to an embodiment, the high-speed amplifier circuit may further include a plurality of pre-amplifier circuits respectively arranged between the first transmission circuit and the at least one first slicer and between the second transmission circuit and the at least one second slicer.

According to an embodiment, in the high-speed amplifier circuit, when a total number of levels is L and a number of linearity ensuring levels set in the high-speed amplifier circuit is S, an operation of $R_p*(S-1)*(2*(L-1))$ level-down is performed for a range $R_p$ of the input positive differential signal, and an operation of $R_n*(S-1)*(2*(L-1))$ level up is performed for a range $R_n$ of the input negative differential signal.

According to an embodiment, the high-speed amplifier circuit may further include at least one processor configured to determine the number of the linearity ensuring levels, based on the total number L of levels.

An N-phase high-speed amplifier circuit according to an embodiment may include a plurality of high-speed amplifier circuits configured to perform N phases of level conversions on a differential signal, wherein each of the plurality of high-speed amplifier circuits may include a first bias conversion circuit, a second bias conversion circuit, a first transmission circuit electrically connected to the first bias conversion circuit and configured to output a first differential signal having a voltage of a level within a first range among all levels, based on the differential signal on which a level-down operation is performed by the first bias conversion circuit, and a second transmission circuit electrically connected to the second bias conversion circuit and configured to output a second differential signal having a voltage of a level within a second range among all the levels, based on the differential signal on which a level-up operation is performed by the second bias conversion circuit, and the first differential signal and the second differential signal output from an N-m-1th-phase high-speed amplifier circuit among the plurality of high-speed amplifier circuits are respectively input to a first bias conversion circuit and a second bias conversion circuit of an N-mth-phase high-speed amplifier circuit where m is an integer of at least 0 but not more than N−2.

According to an embodiment, in the N-phase high-speed amplifier circuit, the first transmission circuit may include a CTLE configured to output the first differential signal by filtering out ISI from the differential signal on which the level-down operation has been performed, and the second transmission circuit may include a CTLE configured to output the second differential signal by filtering out ISI from the differential signal on which the level-up operation has been performed.

According to an embodiment, in the N-phase high-speed amplifier circuit, the first transmission circuit may include an amplifier circuit configured to amplify the differential signal on which the level-down operation has been performed and output the first differential signal, and the second transmission circuit may include an amplifier circuit configured to amplify the differential signal on which the level-up operation has been performed and output the second differential signal.

According to an embodiment, the N-phase high-speed amplifier circuit may further include a plurality of slicers configured to determine a level of a signal output from a high-speed amplifier circuit configured to perform an Nth phase of level conversion from among the plurality of high-speed amplifier circuits.

According to an embodiment, the N-phase high-speed amplifier circuit may further include a plurality of pre-amplifier circuits respectively arranged between the first transmission circuit and at least one first slicer among the plurality of slicers and between the second transmission circuit and at least one second slicer among the plurality of slicers.

According to an embodiment, in the N-phase high-speed amplifier circuit, a positive differential signal corresponding to the differential signal may be input to a first bias conversion circuit of a first-phase high-speed amplifier circuit among the plurality of high-speed amplifier circuits, and a negative differential signal corresponding to the differential signal may be input to a second bias conversion circuit of the first-phase high-speed amplifier circuit among the plurality of high-speed amplifier circuits.

According to an embodiment, in the N-phase high-speed amplifier circuit, when a total number of levels is L and a number of linearity ensuring levels set in the N-phase high-speed amplifier circuit is S, an operation of $R_1*(S-1)*(2*(L-1))$ level-down may be performed for a range $R_1$ of the differential signal input to the first bias conversion circuit, and an operation of $R_2*(S-1)*(2*(L-1))$ level-up may be performed for a range $R_2$ of the differential signal input to the second bias conversion circuit.

According to an embodiment, in the N-phase high-speed amplifier circuit, when the differential signal is a 8-level pulse amplitude modulation (PAM-8) modulated signal, and the plurality of high-speed amplifier circuits perform two phases of level conversion, $R_1$ and $R_2$ of a first-phase high-speed amplifier circuit may be set to 5, and $R_1$ and $R_2$ of a second-phase high-speed amplifier circuit may be set to 3.

According to an embodiment, the N-phase high-speed amplifier circuit may further include at least one processor configured to determine the number of the linearity ensuring levels, based on the total number L of levels.

An electronic device according to an embodiment may include a communication interface, a plurality of input circuits configured to receive a differential signal from the communication interface, a high-speed amplifier circuit electrically connected to the plurality of input circuits, and at least one processor configured to apply a preset voltage or current to the high-speed amplifier circuit, wherein the high-speed amplifier circuit includes a first bias conversion circuit configured to perform a level-down operation on a positive differential signal input via a first input circuit among the plurality of input circuits, a second bias conversion circuit configured to perform a level-up operation on a negative differential signal input via a second input circuit among the plurality of input circuits, a first transmission circuit electrically connected to the first bias conversion circuit and configured to output a first differential signal having a voltage of a level within a first range among all levels, based on the positive differential signal on which the level-down operation has been performed, and a second transmission circuit electrically connected to the second bias conversion circuit and configured to output a second differential signal having a voltage of a level within a second range among all the levels, based on the negative differential signal on which the level-up operation has been performed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
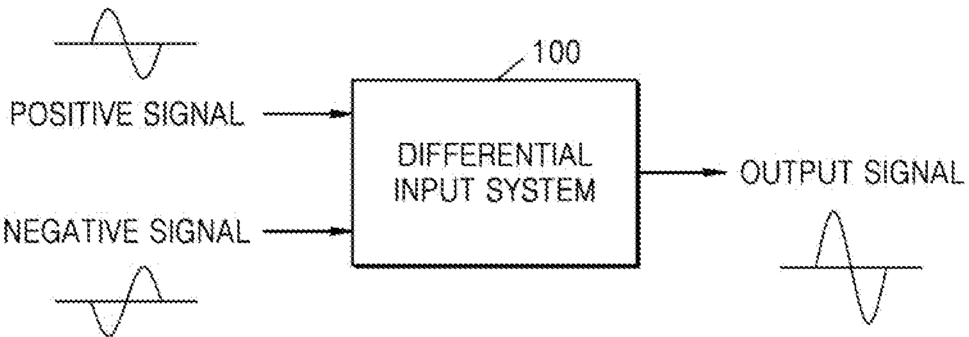
FIG. 1 is a schematic block diagram of a differential input system.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The embodiments described herein and components illustrated in the drawings are merely preferred examples of the disclosure, and many variations may be made therein to substitute for the embodiments and drawings described herein at the time of filing of this application.

Throughout the specification, it will be understood that when a part is referred to as being "connected" or "coupled" to another part, it may be directly connected to or indirectly coupled to the other part, and the indirect connection includes a connection via a wireless communication network.

The terms used herein are for the purpose of describing an embodiment and is not intended to limit the disclosure. Singular expressions used herein are intended to include plural expressions as well unless the context clearly indicates otherwise. The terms such as "comprise," "include," or "have" used herein are intended to specify the presence of stated features, numbers, steps, operations, elements, components, or combinations thereof, but do not preclude the presence or addition of one or more other features, numbers, steps, operations, elements, components, or combinations thereof.

Although the terms including an ordinal number such as "first", "second", etc. may be used herein to describe various elements or components, these elements or components should not be limited by the terms, and the terms are only used to distinguish one element or component from another element or component. For example, as used herein, a first element or component may be termed a second element or component without departing from the scope of the disclosure, and similarly, a second element or component may be termed a first element or component.

Furthermore, terms such as "portion", "device", "block", "member", and "module" used herein may refer to a unit for processing at least one function or operation. For example, the terms may denote at least one hardware element such as a field-programmable gate array (FPGA) or an application-specific integrated circuit (ASIC), at least one software stored in a memory, or at least one process processed by a processor.

Reference numerals assigned to respective operations are used to identify the corresponding operations, and these reference numerals are not intended to indicate the order of the operations, and the operations may be performed in an order different from the specified order unless the context clearly indicates otherwise.

Hereinafter, embodiments are described in detail with reference to the accompanying drawings.

FIG. 1 is a schematic block diagram of a differential input system.

Referring to FIG. 1, a differential input system 100 is a system that uses a positive signal and a negative signal as an input. A signal output via the differential input system 100 may be output as a difference between the positive signal and the negative signal.

When one input port is used when processing a signal, and the signal being processed contains noise, the effect of the noise may not be removed. Thus, the differential input system 100 may obtain an output signal from which noise between input ports is removed by using a difference between the two signals as an input.

Figure 2:
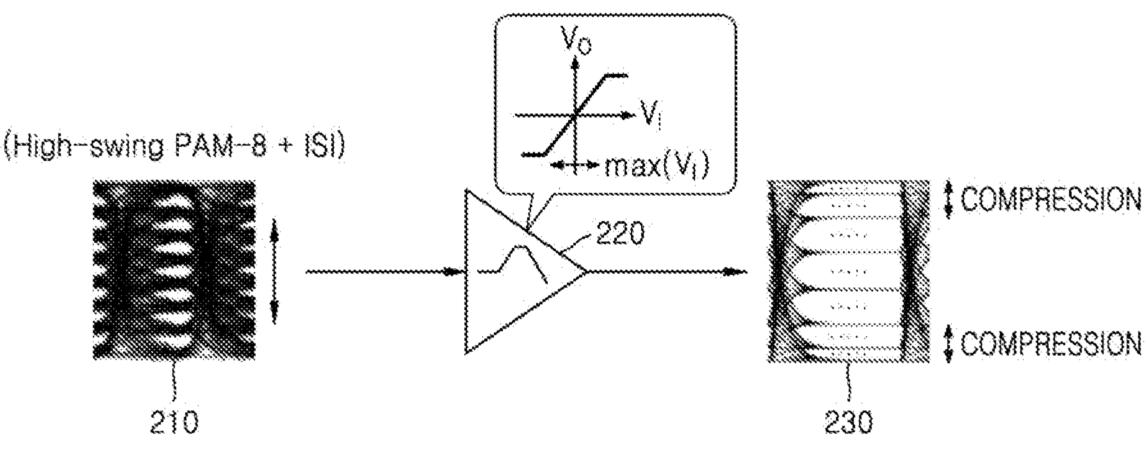
FIG. 2 is a diagram illustrating an equalizer for compensating for channel characteristics of a signal received by an electronic device.

FIG. 2 is a diagram illustrating an equalizer for compensating for channel characteristics of a signal received by an electronic device.

Referring to FIG. 2, an input signal 210 received by an electronic device may be a differential signal modulated using 8-level pulse amplitude modulation (PAM-8). Furthermore, when interference between signals occurs due to channel characteristics experienced by the differential signal, the electronic device may receive an inter-symbol interference (ISI) signal together with the differential signal.

The electronic device may remove the ISI signal by using an equalizer 220. The equalizer 220 has a limited range of input signals for which it is able to maintain linearity. For example, a voltage range over which the linearity of the equalizer 220 is maintained may be max($V_1$). When the equalizer 220 receives the input signal 210 with a voltage outside a range of max($V_1$), signal compression occurs at upper and lower levels of a voltage of the output signal 230. Due to the signal compression, a voltage difference between levels of the signal is reduced below a margin by which a level of the output signal 230 may be correctly determined, and thus, an error may be detected when decoding the output signal 230 at the electronic device.

In particular, when transmitting high-speed signals such as a 4-level PAM (PAM-4) signal and a PAM-8 signal, an error rate due to signal compression is increased because a voltage swing of a signal input to the equalizer 220 is high.

A high-speed amplifier circuit according to an embodiment may convert a level of a differential signal input to the equalizer 220 to solve the problem of an increase in error rate due to limitations of a linearity range when transmitting a high-speed signal with a high voltage swing.

Moreover, the equalizer 220 is an example for illustrating an element with limited linearity, and the high-speed amplifier circuit according to an embodiment may also be applied when inputting a high-speed signal transmission with a high voltage swing to other elements with limited linearity, such as an amplifier (not shown), an analog-to-digital converter (ADC) (not shown), etc. Hereinafter, high-speed amplifier circuits according to embodiments will be described with reference to FIGS. 3 to 14.

Figure 3:
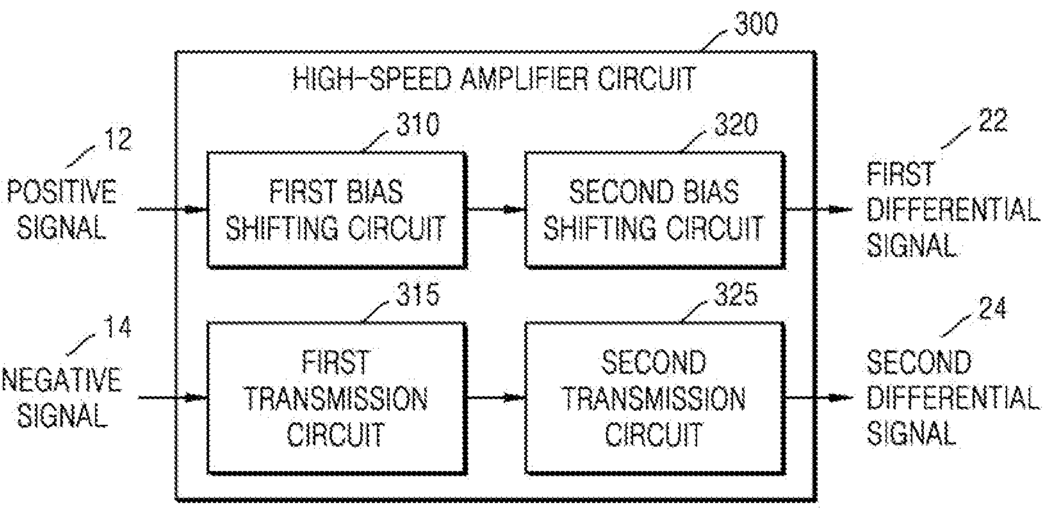
FIG. 3 is a diagram illustrating a high-speed amplifier circuit according to an embodiment.

FIG. 3 is a diagram illustrating a high-speed amplifier circuit according to an embodiment.

Referring to FIG. 3, a high-speed amplifier circuit 300 may include a plurality of bias conversion circuits, i.e., first and second bias conversion circuits 310 and 315, and a plurality of transmission circuits, i.e., first and second transmission circuits 320 and 325. However, this is merely an example, and components of the high-speed amplifier circuit 300 are not limited to those described above. Furthermore, the high-speed amplifier circuit 300 may be included in an electronic device, and a differential signal received via a communication interface in the electronic device may be input to the high-speed amplifier circuit 300. A preset voltage or current may be applied to the high-speed amplifier circuit 300 under the control of at least one processor included in the electronic device.

A positive differential signal 12 and a negative differential signal 14 may be respectively input to the plurality of bias conversion circuits, i.e., the first bias conversion circuit 310 and the second bias conversion circuit 315. For example, the positive differential signal 12 may be input to the first bias conversion circuit 310, and the negative differential signal 14 may be input to the second bias conversion circuit 320. The first bias conversion circuit 310 may perform a level-down operation of the input positive differential signal 12. Furthermore, the second bias conversion circuit 320 may perform a level-up operation of the input negative differential signal 14.

In the disclosure, a level is an indicator determined by a value of a voltage, and a level-down operation refers to an operation of lowering a value of a voltage of an input signal while a level-up operation refers to an operation of increasing a value of a voltage of the input signal. For example, by performing a level-down operation, the value of the voltage may decrease by $V_{SFT1}$, and by performing a level-up operation, the value of the voltage may increase by $V_{SFT1}$. Moreover, the positive differential signal 12 and the negative differential signal 14 are terms used to describe signals generated from a differential signal to have different signs but the same magnitude, and a voltage range for the positive differential signal 12 is not limited to 0 or more and a voltage range for the negative differential signal 14 is not limited to 0 or less.

According to an embodiment, a range over which each of the plurality of bias conversion circuits, i.e., the first and second bias conversion circuits 310 and 315, converts a level of an input signal may be preset. For example, when the total number of levels is L, and the number of levels at which linearity is ensured (hereinafter referred to as 'linearity ensuring levels'), which is set in the high-speed amplifier circuit 300, is S, an operation of $R_p*(S-1)*(2*(L-1))$ level-down may be performed for a range $R_p$ of the input positive differential signal. Additionally, an operation of $R_n*(S-1)*(2*(L-1))$ level-up may be performed for a range $R_n$ of the input negative differential signal.

However, this is merely an example, and a range over which the level of the input signal is converted may be set to a value other than the above-described value. In addition, according to another embodiment, the range over which each of the plurality of bias conversion circuits, i.e., the first and second bias conversion circuits 310 and 315, converts a level of an input signal may be dynamically determined by taking into account channel characteristics, characteristics of elements of a circuit via which the input signal is transmitted, etc.

Of the plurality of transmission circuits, i.e., the first and second transmission circuits 320 and 325, the first transmission circuit 320 is electrically connected to the first bias conversion circuit 310, and the second transmission circuit 325 is electrically connected to the second bias conversion circuit 315. The first transmission circuit 320 and the second transmission circuit 325 may each include at least one of an amplifier, an equalizer, or an ADC. However, this is merely an example, and an element other than the amplifier, equalizer, and ADC, the other element whose linearity is limited depending on a range of the input signal, may be included in each of the first transmission circuit 320 and the second transmission circuit 325. In the disclosure, the equalizer may be described as a continuous-time linear equalizer (CTLE). The CTLE includes one or more CTLE elements and may reduce ISI by filtering out interference between adjacent symbols of the input signal.

The first transmission circuit 320 outputs a first differential signal 22 having a voltage of a level within a first range among all levels, based on the positive differential signal on which the level-down operation is performed by the first bias conversion circuit 310. For example, when the positive differential signal is a PAM-8 signal, the total number of levels is 8 (level 0 to level 7), and the first range may be set from level 3 to level 7. The second transmission circuit 320 outputs a second differential signal 24 having a voltage of a level within a second range among all the levels, based on the negative differential signal on which the level-up operation is performed by the second bias conversion circuit 315. For example, when the negative differential signal is a PAM-8 signal, the total number of levels is 8 (level 0 to level 7), and the second range may be set from level 0 to level 4.

The first range and the second range are an example, and may be set differently depending on the number of linearity ensuring levels set in the high-speed amplifier circuit 300. In addition, although the PAM-8 signal has been described as an example for convenience of description, a PAM-4 signal may be input to the high-speed amplifier circuit 300 according to an embodiment, or a signal with a higher speed (e.g., 16-level PAM (PAM-16) signal) than the PAM-8 signal may be input to the high-speed amplifier circuit 300 according to an embodiment.

Figure 4A:
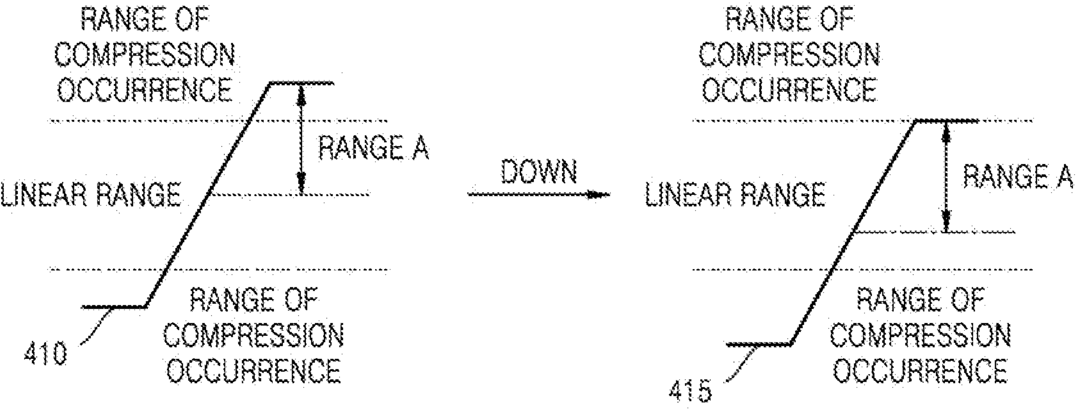
FIG. 4A is a diagram illustrating the principle of achieving linearity via level conversion of a positive differential signal in a high-speed amplifier circuit according to an embodiment.

FIG. 4A is a diagram illustrating the principle of achieving linearity via level conversion of a positive differential signal in a high-speed amplifier circuit according to an embodiment.

Referring to FIG. 4A, a positive differential signal 410 having a high voltage swing may be input to a transmission circuit (not shown). When the transmission circuit includes an element that limits a range of the input signal for which linearity is maintained (hereinafter, a 'linear range'), compression may occur in an output signal of the transmission circuit. For convenience of explanation, a range other than the linear range is referred to as a range of compression occurrence.

The high-speed amplifier circuit may convert a level of the positive differential signal 410 such that linearity is maintained for a range A of the positive differential signal 410. The high-speed amplifier circuit may perform a level-down operation so that the range A of the positive differential signal 410 falls within the linear range, and a magnitude of a voltage by which a level of the positive differential signal 410 is shifted down may be determined according to one of the embodiments described above with reference to FIG. 3.

Figure 4B:
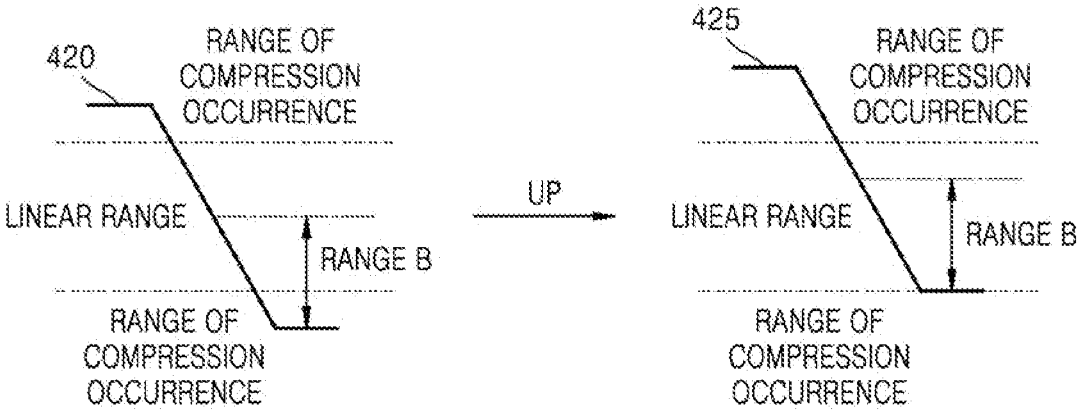
FIG. 4B is a diagram illustrating the principle of achieving linearity via level conversion of a negative differential signal in a high-speed amplifier circuit according to an embodiment.

FIG. 4B is a diagram illustrating the principle of achieving linearity via level conversion of a negative differential signal in a high-speed amplifier circuit according to an embodiment.

Referring to FIG. 4B, a negative differential signal 420 having a high voltage swing may be input to the transmission circuit. As described with reference to FIG. 4A, when the transmission circuit includes an element that limits a range of the input signal for which linearity is maintained, compression may occur in an output signal of the transmission circuit.

The high-speed amplifier circuit may convert a level of the negative differential signal 420 such that the linearity is maintained for a range B of the negative differential signal 420. The high-speed amplifier circuit may perform a level-up operation so that the range B of the negative differential signal 420 falls within the linear range, and a magnitude of a voltage by which a level of the negative differential signal 420 is shifted up may be determined according to one of the embodiments described above with reference to FIG. 3.

In FIGS. 4A and 4B, the range A may include at least some of all levels configured in a system, the range B may include at least some of all possible levels, and the range A and the range B may overlap.

According to an embodiment, for differential signals processed and output by the high-speed amplifier circuit, linearity may be satisfied for levels from the top 0% to 40% of all the levels to the top 0% to 60% thereof. It is more desirable that for the differential signals processed and output by the high-speed amplifier circuit, linearity may be satisfied for the top 0% to 50% of all the levels.

Specific experimental data related to this may be described based on graphs of FIGS. 6A to 7B, as described below.

In the above-described embodiments, it is assumed that the high-speed amplifier circuit includes two bias conversion circuits. However, this is merely an embodiment, and the high-speed amplifier circuit may include three or more bias conversion circuits.

Figure 5:
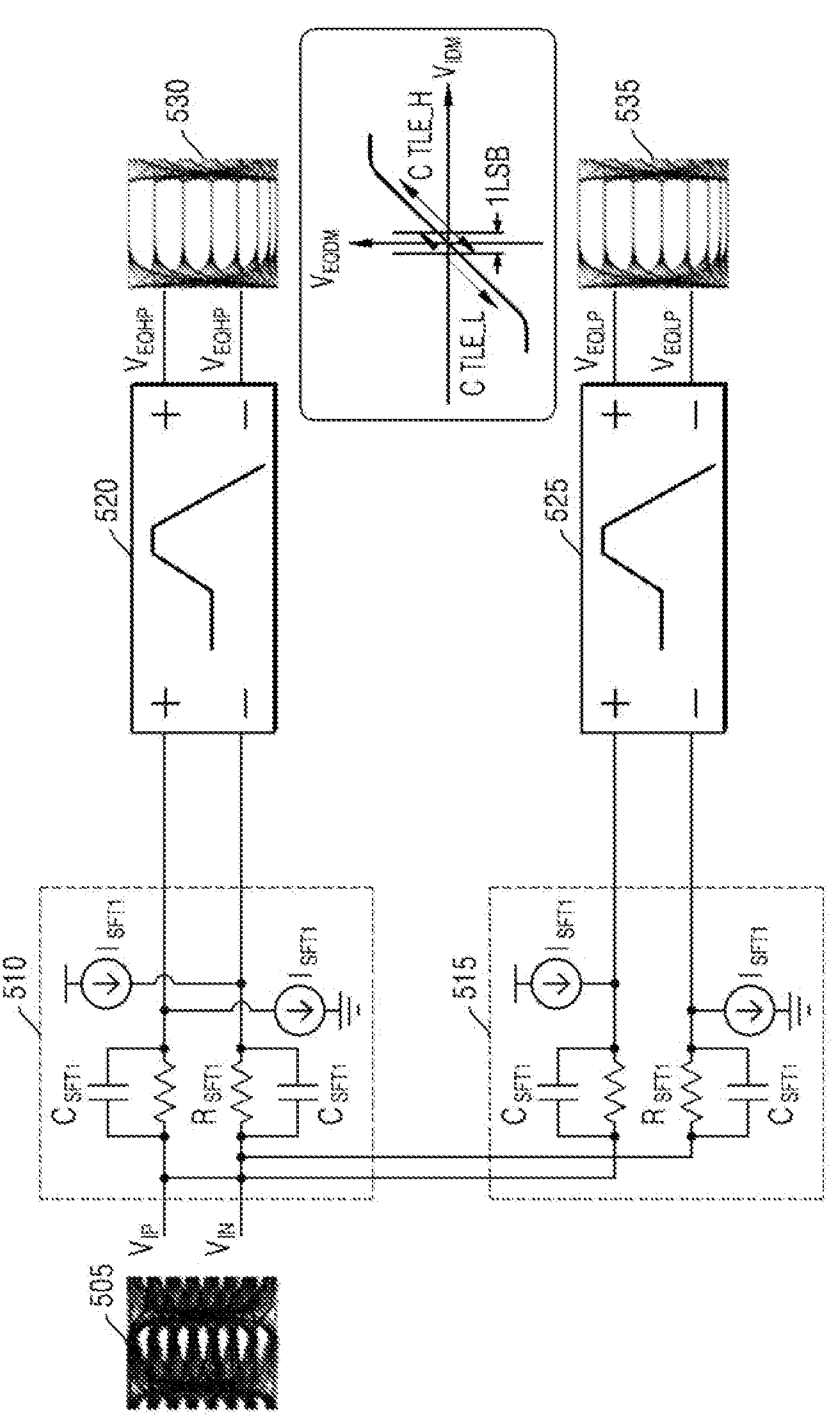
FIG. 5 is a diagram illustrating a method of converting a level of a differential signal to ensure linearity in a high-speed amplifier circuit according to an embodiment.

FIG. 5 is a diagram illustrating a method of converting a level of a differential signal to ensure linearity in a high-speed amplifier circuit according to an embodiment.

Referring to FIG. 5, the high-speed amplifier circuit may include a first bias conversion circuit 510, a second bias conversion circuit 515, a first CTLE 520, and a second CTLE 525. In the embodiment of FIG. 5, a case in which the transmission circuit of the high-speed amplifier circuit described above with reference to FIG. 3 is configured as a CTLE is described.

A differential signal 505 may be input to the high-speed amplifier circuit. A signal input to the first bias conversion circuit 510 based on the differential signal 505 is described as a positive differential signal, and a signal input to the second bias conversion circuit 515 based on the differential signal 505 is described as a negative differential signal. Furthermore, in the embodiment of FIG. 5, each of the first bias conversion circuit 510 and the second bias conversion circuit 515 may be composed of a current source, a resistor $R_{SFT1}$, and a capacitor $C_{SFT1}$.

The first bias conversion circuit 510 may perform a level-down operation on the positive differential signal. In detail, in the first bias conversion circuit 510, a voltage drop may occur as current $I_{SFT1}$ flows across the resistor $R_{SFT1}$ in a direction from an input to an output of the high-speed amplifier circuit, which may cause shifting-down of the level of the positive differential signal. Control of a magnitude of the dropped voltage may be performed by adjusting the current $I_{SFT1}$.

The second bias conversion circuit 515 may perform a level-up operation on the negative differential signal. In detail, in the second bias conversion circuit 515, a voltage increase may occur as current $I_{SFT1}$ flows across the resistor $R_{SFT1}$ in a direction from the output of the high-speed amplifier circuit to the input thereof, which may cause shifting-up of a level of a negative differential signal. Control of a magnitude of the increased voltage may be performed by adjusting the current $I_{SFT1}$.

The positive differential signal with the level shifted down may be input from the first bias conversion circuit 510 to the first CTLE 520. The first CTLE 520 may filter out high frequency peaking and ISI. A first differential signal 530 having a voltage of a level within a first range among all levels may be output from the first CTLE 520, based on the positive differential signal on which the level-down operation is performed. By inputting, to the first CTLE 520, the positive differential signal of which a level is shifted down within a linear range, the linearity for the output first differential signal 530 CTLE_H may be maintained.

The negative differential signal with the level shifted up may be input from the second bias conversion circuit 515 to the second CTLE 525. The second CTLE 525 may filter out high-frequency peaking and ISI. A second differential signal 535 having a voltage of a level within a second range among all the levels may be output from the second CTLE 525, based on the negative differential signal on which the level-up operation is performed. By inputting, to the second CTLE 525, the negative differential signal of which a level is shifted up within the linear range, the output second differential signal 535 CTLE_H may maintain linearity.

Referring to an eye diagram of the first differential signal 530 and an eye diagram of the second differential signal 535 shown in FIG. 5, it can be seen that in the case of the first differential signal 530, linearity is maintained for the top five levels (level 3 to level 7) among all levels, and in the case of the second differential signal 535, linearity is maintained for the lower 5 levels (level 0 to level 4) among all the levels. Through this, the high-speed amplifier circuit may output a differential signal for which linearity is maintained over a total of eight levels (level 0 to level 7). Thereafter, by processing the signal output from the high-speed amplifier circuit in the digital domain, a signal with ensured linearity over the entire input range may be obtained.

Figure 6A:
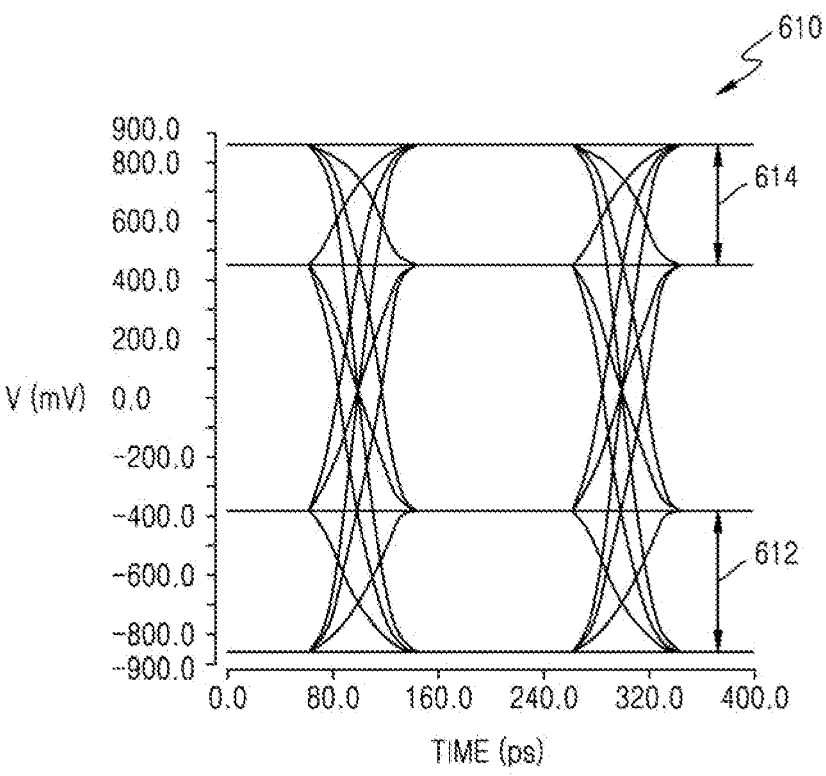
FIG. 6A is a graph illustrating a differential signal output from a transmission circuit when level conversion is not applied, according to an embodiment.

FIG. 6A is a graph illustrating a differential signal output from a transmission circuit when level conversion is not applied, according to an embodiment.

A signal output when a differential signal modulated using PAM-4 modulation is input to a transmission circuit is described with reference to FIG. 6A. For a differential signal on which level conversion is not performed according to an embodiment, signal compression may occur in a range outside a linear range of the transmission circuit. As seen in a graph 610 of FIG. 6A, a voltage difference 612 between level 0 and level 1 decreases, and the voltage difference 614 between level 2 and level 3 decreases. A voltage difference between levels across all the levels 0 to 3 is not maintained at or above a certain level due to the compression, which may increase a decoding error rate in the digital domain.

Figure 6B:
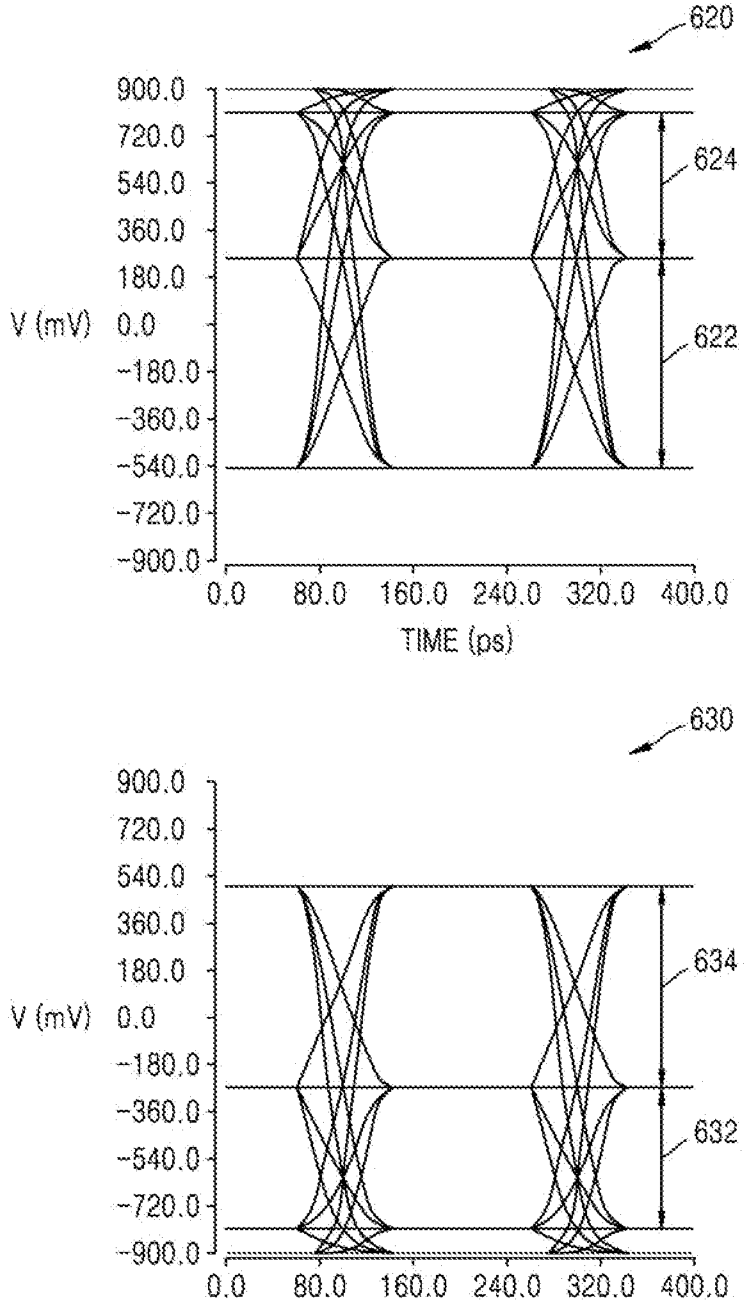
FIG. 6B is a graph illustrating a differential signal output from a high-speed amplifier circuit performing level conversion, according to an embodiment.

FIG. 6B is a graph illustrating a differential signal output from a high-speed amplifier circuit performing level conversion, according to an embodiment.

In FIG. 6B, it is assumed that a differential signal modulated with PAM-4 modulation is input to the high-speed amplifier circuit. A first graph 620 shows a voltage for each level of a first differential signal output as a result of performing level conversion on a positive differential signal obtained based on the differential signal. As seen in the first graph 620, among four levels (level 0 to level 3) used in PAM-4 modulation, a voltage difference 622 between level 0 and level 1 and a voltage difference 624 between level 1 and level 2 are maintained at or above a certain level.

A second graph 630 shows a voltage for each level of a second differential signal output as a result of performing level conversion on a negative differential signal obtained based on the differential signal. As seen in the second graph 630, among four levels (level 0 to level 3) in PAM-4 modulation, a voltage difference 632 between level 1 and level 2 and a voltage difference 634 between level 2 and level 3 are maintained at or above a certain level.

That is, by performing level conversion on a differential signal according to the disclosure, it is possible to prevent a voltage difference between specific levels within the entire level range from being reduced due to compression. In the digital domain, parallel data of the first differential signal and the second differential signal may be processed to output data with ensured linearity over the entire input range in PAM-4 modulation, thereby reducing a decoding error rate in the digital domain.

Figure 7A:
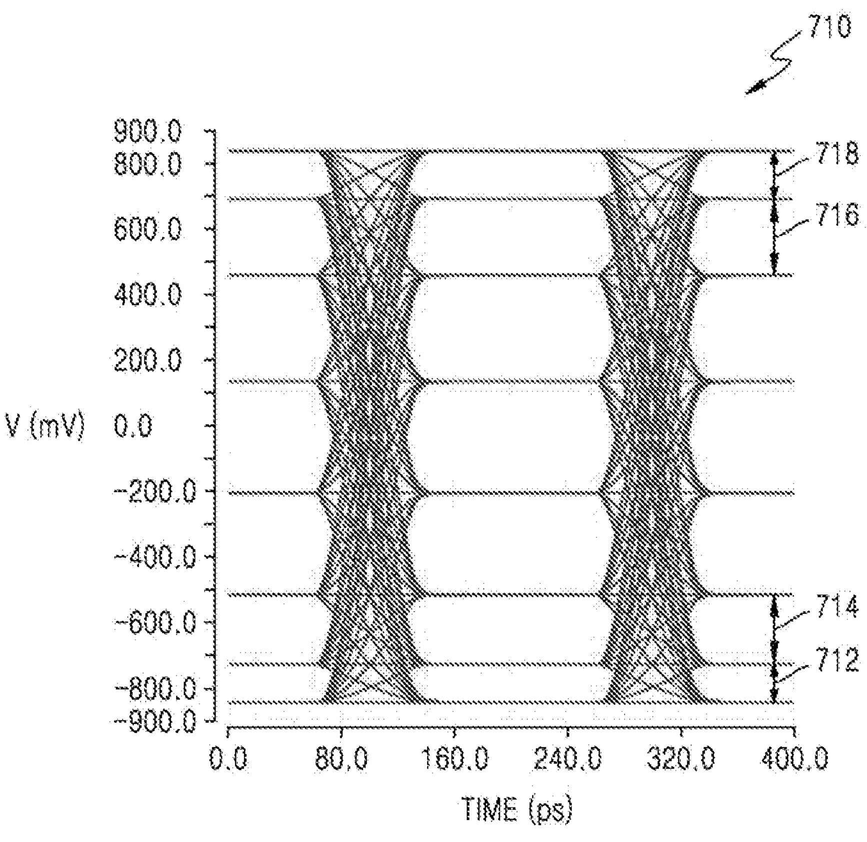
FIG. 7A is a graph illustrating a differential signal output from a transmission circuit when level conversion is not applied, according to an embodiment.

FIG. 7A is a graph illustrating a differential signal output from a transmission circuit when level conversion is not applied, according to an embodiment.

A signal output when a differential signal modulated using PAM-8 modulation is input to a transmission circuit is described with reference to FIG. 7A. For a differential signal on which level conversion is not performed according to an embodiment, distortion occurs when an input swing is high. As seen in a graph 710 of FIG. 7A, a voltage difference 712 between level 0 and level 1, a voltage difference 714 between level 1 and level 2, a voltage difference 716 between level 5 and level 6, and a voltage difference 718 between level 6 and level 7 are each reduced compared to voltage differences between the other levels. Compression, which is a phenomenon in which a voltage difference between levels is reduced, may occur due to a high input swing outside a linear range. A voltage difference between levels across all levels 0 to 7 in PAM-8 modulation is not maintained at or above a certain level due to the compression, which may increase a decoding error rate in the digital domain.

Figure 7B:
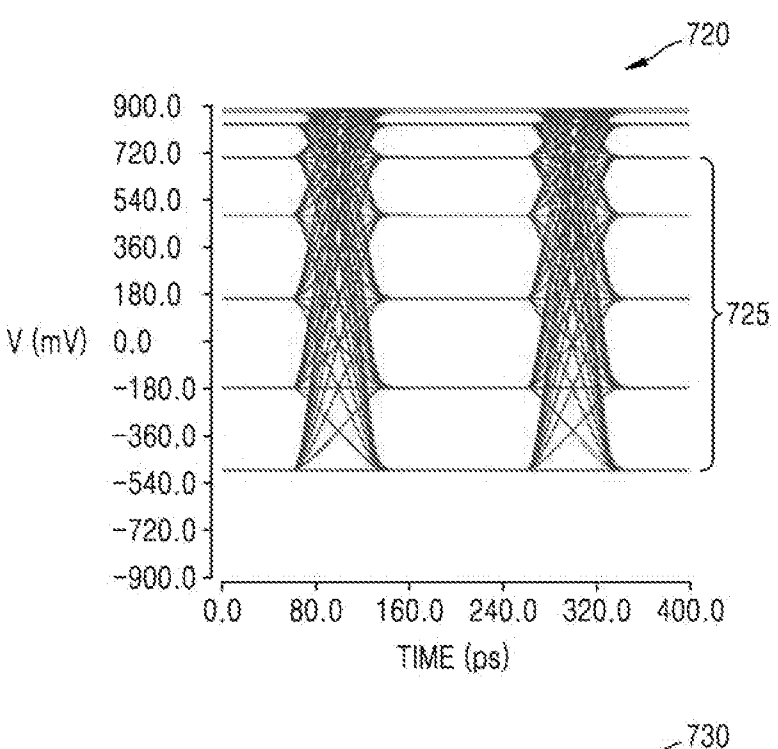
FIG. 7B is a graph illustrating a differential signal output from a high-speed amplifier circuit performing level conversion according to an embodiment.
Figure 7B:
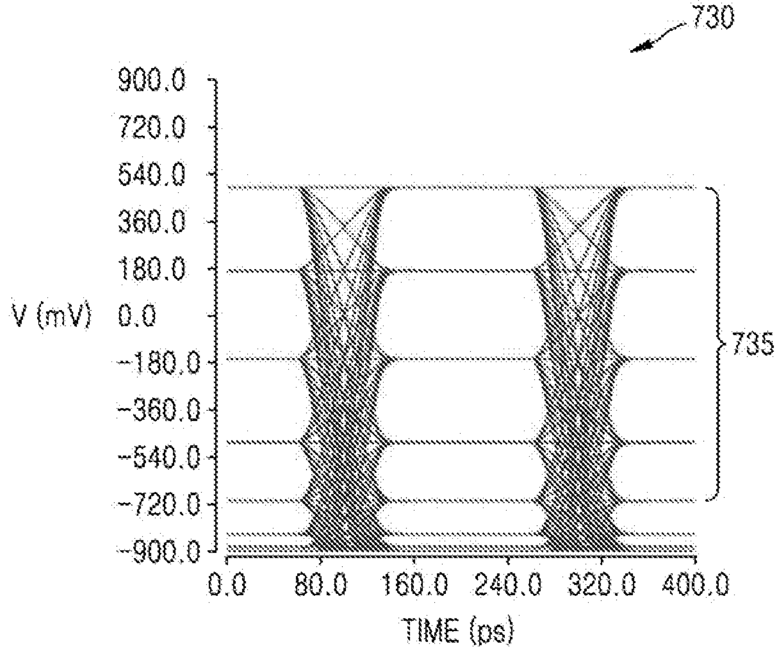

FIG. 7B is a graph illustrating a differential signal output from a high-speed amplifier circuit performing level conversion according to an embodiment.

In FIG. 7B, it is assumed that a differential signal modulated with PAM-8 modulation is input to the high-speed amplifier circuit. A first graph 720 shows a voltage for each level of a first differential signal output as a result of performing level conversion on a positive differential signal obtained based on the differential signal. As seen in the first graph 720, a voltage difference between adjacent levels within a range 725 of level 3 to level 7 among the eight levels (level 0 to level 7) in PAM-8 modulation is maintained at or above a certain level.

A second graph 730 shows a voltage for each level of a second differential signal output as a result of performing level conversion on a negative differential signal obtained based on the differential signal. As seen in the second graph 730, a voltage difference between adjacent levels within a range 735 of level 0 to level 4 among the eight levels (level 0 to level 7) in PAM-8 modulation is maintained at or above a certain level.

That is, by performing level conversion on a differential signal according to the disclosure, it is possible to prevent a voltage difference between specific levels within the entire level range from being reduced due to compression. In the digital domain, parallel data of the first and second differential signals may be processed to output data with ensured linearity over the entire input range in PAM-8 modulation, thereby reducing a decoding error rate in the digital domain.

Figure 8:
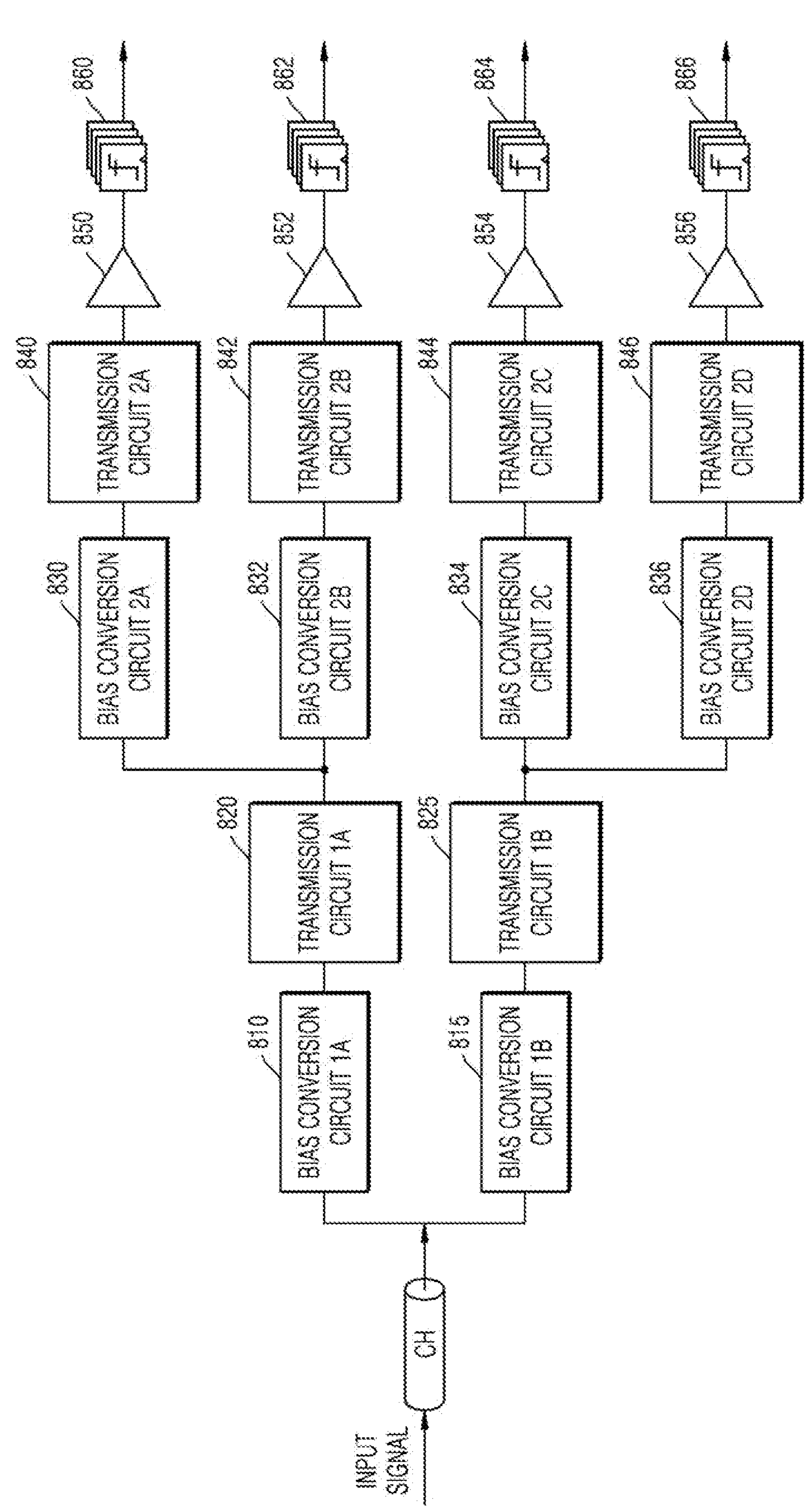
FIG. 8 is a diagram illustrating an N-phase high-speed amplifier circuit according to an embodiment.

FIG. 8 is a diagram illustrating an N-phase high-speed amplifier circuit according to an embodiment.

An N-phase high-speed amplifier circuit according to an embodiment may include a plurality of high-speed amplifier circuits that perform N phases of level conversions on a differential signal. Each of the plurality of high-speed amplifier circuits may include a plurality of bias conversion circuits (e.g., 810 and 815) and a plurality of transmission circuits (e.g., 820 and 825). In this case, high-speed amplifier circuits of the same phase may be connected in parallel, and high-speed amplifier circuits of different phases may be sequentially connected to each other. For example, a first differential signal and a second differential signal output from an N-m-1th phase high-speed amplifier circuit among the plurality of high-speed amplifier circuits are sequentially input to a first bias conversion circuit and a second bias conversion circuit of an N-mth phase high-speed amplifier circuit. In this case, m may be set to an integer of 0 to N−2.

In addition, as shown in FIG. 8, the N-phase high-speed amplifier circuit may further include a plurality of pre-amplifier circuits 850, 852, 854, and 856 and a plurality of slicers 860, 862, 864, and 866. The plurality of slicers 860, 862, 864, and 866 may determine a level of a signal output from a high-speed amplifier circuit performing an Nth phase of level conversion from among the plurality of high-speed amplifier circuits. In addition, the plurality of pre-amplifier circuits 850, 852, 854, and 856 may be arranged between the high-speed amplifier circuit performing the Nth phase of level conversion and the plurality of slicers 860, 862, 864, and 866. However, this is merely an embodiment, and the components of the N-phase high-speed amplifier circuit are not limited to those described above. The N-phase high-speed amplifier circuit may include fewer or more components than those described above.

Assuming that N is 2, a differential signal input to and a differential signal output from a two-phase high-speed amplifier circuit are described with reference to FIG. 8. The two-phase high-speed amplifier circuit according to an embodiment may consist of one first-phase high-speed amplifier circuit and two second-phase high-speed amplifier circuits.

A differential signal may be received as an input signal to the first-phase high-speed amplifier circuit. The first-phase high-speed amplifier circuit may include a bias conversion circuit 1a 810, a bias conversion circuit 1b 815, a transmission circuit 1a 820, and a transmission circuit 1b 825. A signal input to the bias conversion circuit 1a 810 based on the differential signal is described as a positive differential signal, and a signal input to the bias conversion circuit 1b based on the differential signal is described as a negative differential signal. The bias conversion circuit 1a 810 may perform a level-down operation of the input positive differential signal, and the bias conversion circuit 1b 815 may perform a level-up operation of the input negative differential signal.

Moreover, the positive differential signal and the negative differential signal are terms used to describe signals generated from the differential signal to have different signs but the same magnitude, and a voltage range for the positive differential signal is not limited to 0 or more and a voltage range for the negative differential signal is not limited to 0 or less.

A range over which each of the bias conversion circuit 1a 810 and the bias conversion circuit 1b 815 converts a level of an input signal may be preset. For example, when the total number of levels is L, and the number of linearity ensuring levels set in the high-speed amplifier circuit 300 is S, an operation of $R_1*(S-1)*(2*(L-1))$ level-down may be performed for a range $R_1$ of the input positive differential signal. Furthermore, an operation of $R_2*(S-1)*(2*(L-1))$ level-up may be performed for a range $R_2$ of the differential signal input to the bias conversion circuit 1b 815. For example, when the differential signal is a PAM-8 modulated signal and the plurality of high-speed amplifier circuits perform two-phases of level conversion, ranges $R_1$ and $R_2$ of the first-phase high-speed amplifier circuit may be set to 5, and ranges $R_1$ and $R_2$ of the second-phase high-speed amplifier circuit may be set to 3.

However, this is merely an example, and a range over which the level of the input signal is converted may be set to a value other than the above-described value. In addition, according to another embodiment, the range over which each of the bias conversion circuit 1a 810 and the bias conversion circuit 1b 815 converts a level of an input signal may be dynamically determined by a processor (not shown), taking into account channel characteristics, characteristics of elements of a circuit via which the input signal is transmitted, etc.

In the first-phase high-speed amplifier circuit, the transmission circuit 1a 820 may be electrically connected to the bias conversion circuit 1a 810, and the transmission circuit 1b 825 may be electrically connected to the bias conversion circuit 1b 815. The transmission circuit 1a 820 and the transmission circuit 1b 825 may each include at least one of an amplifier, an equalizer, or an ADC. However, this is merely an example, and an element other than the amplifier, equalizer, and ADC, the other element whose linearity is limited depending on a range of the input signal, may be included in each of the transmission circuit 1a 820 and the transmission circuit 1b 825.

The transmission circuit 1a 820 may output a differential signal 1a having a voltage of a level within a range 1a among all levels, based on the positive differential signal of which a level is shifted down by the bias conversion circuit 1a 810. The transmission circuit 1b 825 may output a differential signal 1b having a voltage of a level within a range 1b among all the levels, based on the negative differential signal of which a level is shifted up by the bias conversion circuit 1b 815.

The differential signal 1a and the differential signal 1b output from the first-phase high-speed amplifier circuit may respectively be input to the second-phase high-speed amplifier circuits. Hereinafter, for convenience of description, a high-speed amplifier circuit receiving the differential signal 1a among the second-phase high-speed amplifier circuits is referred to as a 2nd-1 high-speed amplifier circuit, and a high-speed amplifier circuit receiving the differential signal 1b is referred to as a 2nd-2 high-speed amplifier circuit.

The 2nd-1 high-speed amplifier circuit may include a bias conversion circuit 2a 830, a bias conversion circuit 2b 832, a transmission circuit 2a 840, and a transmission circuit 2b 842. Differential signals (hereinafter referred to as a differential signal 2a and a differential signal 2b) that are level converted to different values based on the differential signal 1a output from the first-phase high-speed amplifier circuit may be respectively input to the bias conversion circuit 2a 830 and the bias conversion circuit 2b 832. The bias conversion circuit 2a 830 may perform a level-down operation of the input differential signal 2a, and the bias conversion circuit 2b 832 may perform a level-up operation of the input differential signal 2b. In the second-phase high-speed amplifier circuit, the transmission circuit 2a 840 may be electrically connected to the bias conversion circuit 2a 830, and the transmission circuit 2b 842 may be electrically connected to the bias conversion circuit 2b 832.

The transmission circuit 2a 840 may output a differential signal having a voltage of a level within a range 2a among all levels, based on the differential signal 2a of which a level is shifted down by the bias conversion circuit 2a 830. The transmission circuit 2b 842 may output a differential signal having a voltage of a level within a range 2b among all the levels, based on the differential signal 2b of which a level is shifted up by the bias conversion circuit 2b 832.

Moreover, the 2nd-2 high-speed amplifier circuit may include a bias conversion circuit 2c 834, a bias conversion circuit 2d 836, a transmission circuit 2c 844, and a transmission circuit 2d 846, and perform operations corresponding to those of the 2nd-1 high-speed amplifier circuit based on the differential signal 2b input from the first-phase high-speed amplifier circuit. However, a range for a level of a signal output from the 2nd-1 high-speed amplifier circuit is different from a range for a level of a signal output from the 2nd-2 high-speed amplifier circuit. For example, the transmission circuit 2c 844 may output a differential signal having a voltage of a level within a range 2c among all levels, based on a differential signal 2c of which a level is shifted down by the bias conversion circuit 2c 834. Furthermore, the transmission circuit 2d 846 may output a differential signal having a voltage of a level within a range 2d among all the levels, based on a differential signal 2d of which a level is shifted up by the bias conversion circuit 2d 836.

Figure 9:
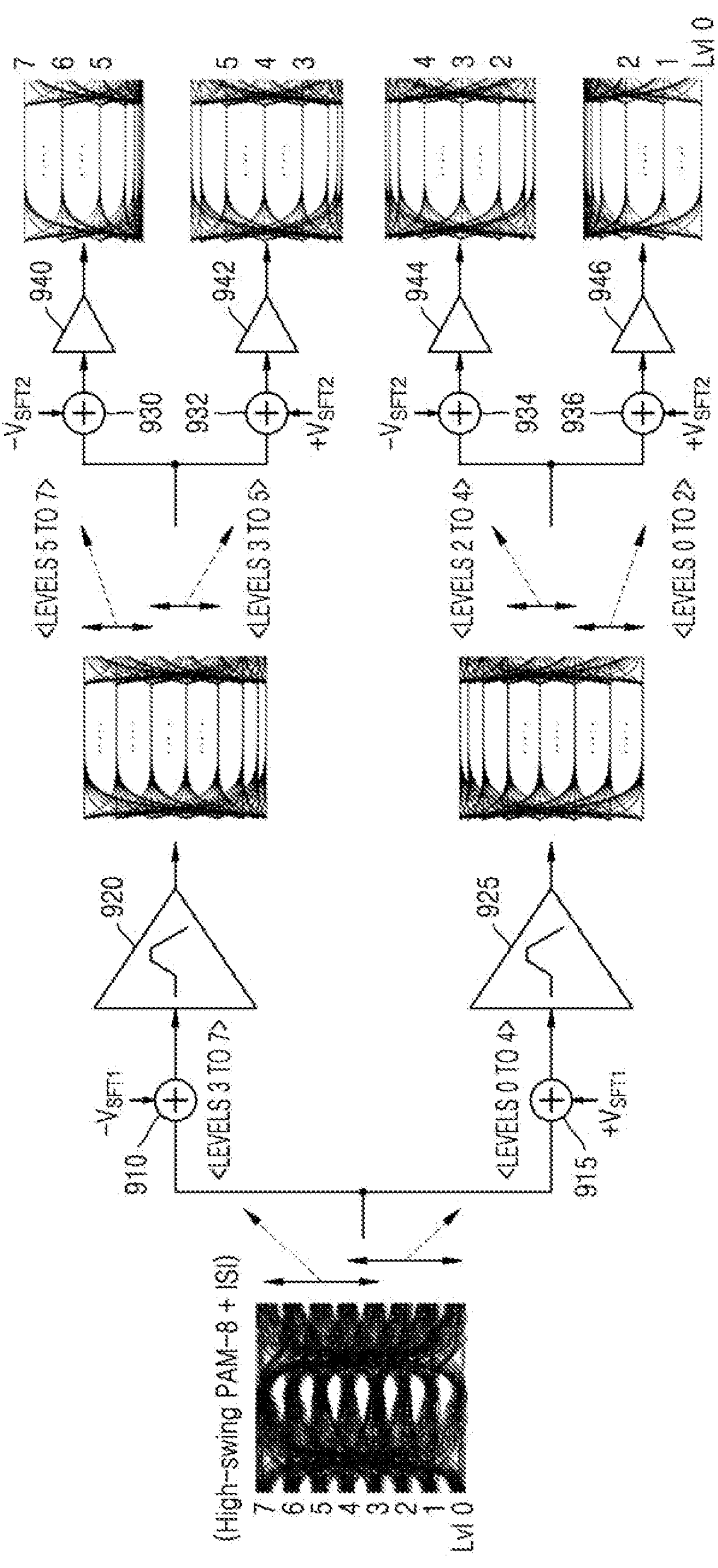
FIG. 9 is a diagram illustrating a method of converting a level of a differential signal to ensure linearity in an N-phase high-speed amplifier circuit according to an embodiment.

FIG. 9 is a diagram illustrating a method of converting a level of a differential signal to ensure linearity in an N-phase high-speed amplifier circuit according to an embodiment.

In the embodiment of FIG. 9, the N-phase high-speed amplifier circuit is assumed to be a two-phase high-speed amplifier circuit in which N is set to 2, and a case in which the transmission circuit of the N-phase high-speed amplifier circuit described above with reference to FIG. 8 is configured as a CTLE is described.

The two-phase high-speed amplifier circuit may receive a differential signal modulated using PAM-8 modulation as an input. The differential signal may pass through a channel from an electronic device on a transmitting side and then be input to the two-phase high-speed amplifier circuit installed in an electronic device on a receiving side, and due to channel characteristics, an ISI signal may be received along with the differential signal.

A level-down operation may be performed by a bias conversion circuit 1a 910 on a positive differential signal generated based on the input differential signal. The positive differential signal of which a level is shifted down by a voltage $V_{SFT1}$ according to the level-down operation may be input to a CTLE 1a 920 from the bias conversion circuit 1a 910. The CTLE 1a 920 may perform ISI filtering, and output a differential signal 1a having a voltage of a level within a range 1a among all levels. For example, when the positive differential signal is a PAM-8 signal, the total number of levels are 8 (level 0 to level 7), and the range 1a may be set from level 3 to level 7.

The differential signal 1a may be input to a 2nd-1 high-speed amplifier circuit. The 2nd-1 high-speed amplifier circuit may include a bias conversion circuit 2a 930, a bias conversion circuit 2b 932, a CTLE 2a 940, and a CTLE 2b 942. Signals (hereinafter referred to as a differential signal 2a and a differential signal 2b) that are level converted to different values based on the differential signal 1a output from the first-phase high-speed amplifier circuit may be respectively input to the bias conversion circuit 2a 930 and the bias conversion circuit 2b 932. The bias conversion circuit 2a 930 may perform a level-down operation of the input differential signal 2a, and the bias conversion circuit 2b 932 may perform a level-up operation of the input differential signal 2b.

The CTLE 2a 940 may output a differential signal having a voltage of a level within a range 2a among all levels, based on the differential signal 2a of which a level is shifted down by $V_{SFT2}$ from the bias conversion circuit 2a 930. For example, the range 2a may be set from level 5 to level 7. The CTLE 2b 942 may output a differential signal having a voltage of a level within a range 2b among all the levels, based on the differential signal 2b of which a level is shifted up by $V_{SFT2}$ from the bias conversion circuit 2b 932. For example, the range 2b may be set from level 3 to level 5.

A level-up operation may be performed by a bias conversion circuit 1b 915 on a negative differential signal generated based on the input differential signal. The negative differential signal of which a level is shifted up by a voltage $V_{SFT1}$ according to the level-up operation may be input to a CTLE 1b 925 from the bias conversion circuit 1b 915. The CTLE 1b 925 may perform ISI filtering, and output a differential signal 1b having a voltage of a level within a range 1b among all the levels. For example, when the negative differential signal is a PAM-8 signal, the total number of levels is 8 (level 0 to level 7), and the range 1b may be set from level 0 to level 4.

The differential signal 1b may be input to the 2nd-2 high-speed amplifier circuit. The 2nd-2 high-speed amplifier circuit may include a bias conversion circuit 2c 934, a bias conversion circuit 2d 936, a CTLE 2c 944, and a CTLE 2d 946. Signals (hereinafter referred to as a differential signal 2c and a differential signal 2d) that are level converted to different values based on the differential signal 1b output from the first-phase high-speed amplifier circuit may be respectively input to the bias conversion circuit 2c 934 and the bias conversion circuit 2d 936. The bias conversion circuit 2c 934 may perform a level-down operation of the input differential signal 2c, and the bias conversion circuit 2d 936 may perform a level-up operation of the input differential signal 2d.

The CTLE 2c 944 may output a differential signal having a voltage of a level within a range 2c among all levels, based on the differential signal 2c of which a level is shifted down by $V_{SFT2}$ from the bias conversion circuit 2c 934. For example, the range 2c may be set from level 2 to level 4. The CTLE 2d 946 may output a differential signal having a voltage of a level within a range 2d among all the levels, based on the differential signal 2d of which a level is shifted up by $V_{SFT2}$ from the bias conversion circuit 2d 936. For example, the range 2d may be set from level 0 to level 2.

It can be seen that the differential signal 2a and the differential signal 2b output from the 2nd-1 high-speed amplifier circuit have a large voltage difference between their levels compared to the differential signal 1a output by performing the level conversion once. It can also be seen that the differential signal 2c and the differential signal 2d output from the 2nd-2 high-speed amplifier circuit have a large voltage difference between their levels compared to the differential signal 1b output by performing the level conversion once. In addition, due to this, a differential signal output by the second-phase high-speed amplifier circuit is less prone to decoding errors at a digital stage than a differential signal output by the first-phase high-speed amplifier circuit alone.

Figure 10:
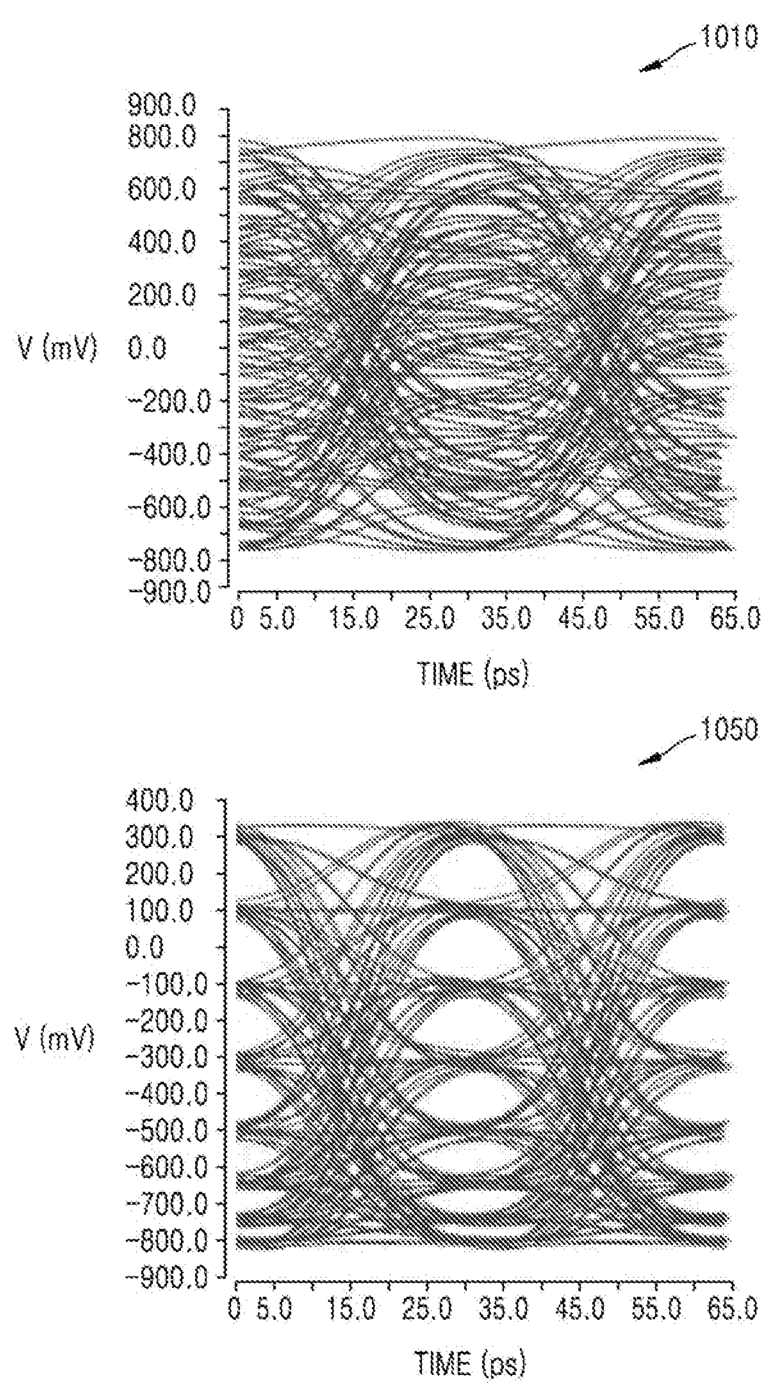
FIG. 10 is a graph illustrating an eye diagram of an output signal when a differential signal modulated using 8-level pulse width modulation (PAM-8) modulation is input to a high-speed amplifier circuit according to an embodiment.

FIG. 10 is a graph illustrating an eye diagram of an output signal when a differential signal modulated using PAM-8 modulation is input to a high-speed amplifier circuit according to an embodiment.

Referring to FIG. 10, a first graph 1010 is an eye diagram when a differential signal modulated with PAM-8 modulation passes through a channel. An eye diagram refers to a diagram in which a signal observed over the time is divided into time periods and then superimposed on top of one another.

A second graph 1050 illustrated in FIG. 10 is an eye diagram of a differential signal within a first range, which is output after a level-down operation is performed in a high-speed amplifier circuit according to an embodiment. As seen in the second graph 1050 of FIG. 10, the differential signal within the first range may be output as a signal in which linearity is satisfied for the top four levels among a total of eight levels.

Figure 11:
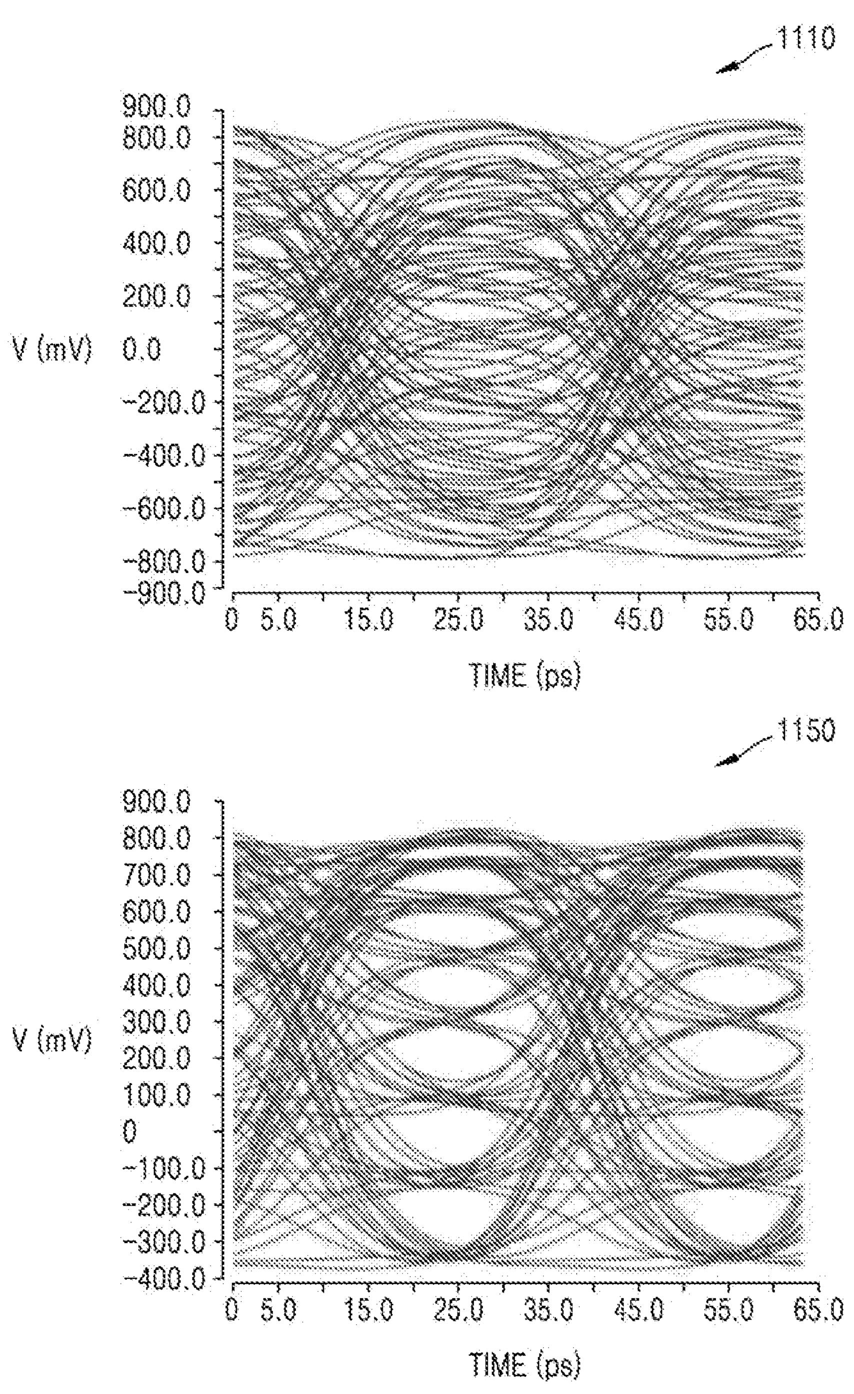
FIG. 11 is a graph illustrating an eye diagram of an output signal when a differential signal modulated using PAM-8 modulation is input to a high-speed amplifier circuit according to an embodiment.

FIG. 11 is a graph illustrating an eye diagram of an output signal when a differential signal modulated using PAM-8 modulation is input to a high-speed amplifier circuit according to an embodiment.

Referring to FIG. 11, a first graph 1110 is an eye diagram when a differential signal modulated using PAM-8 modulation passes through a channel.

A second graph 1150 illustrated in FIG. 11 is an eye diagram of a differential signal within a second range, which is output after a level-up operation is performed in a high-speed amplifier circuit according to an embodiment. As seen in the second graph 1150 of FIG. 11, the differential signal within the second range may be output as a signal in which linearity is satisfied for the bottom four levels among the total of eight levels.

Referring to the second graph 1050 of FIG. 10 and the second graph 1150 of FIG. 11 described above, it can be seen that linearity is ensured for a total of eight levels in PAM modulation by using differential signals that are output in parallel by performing one-phase level conversion.

Figure 12:
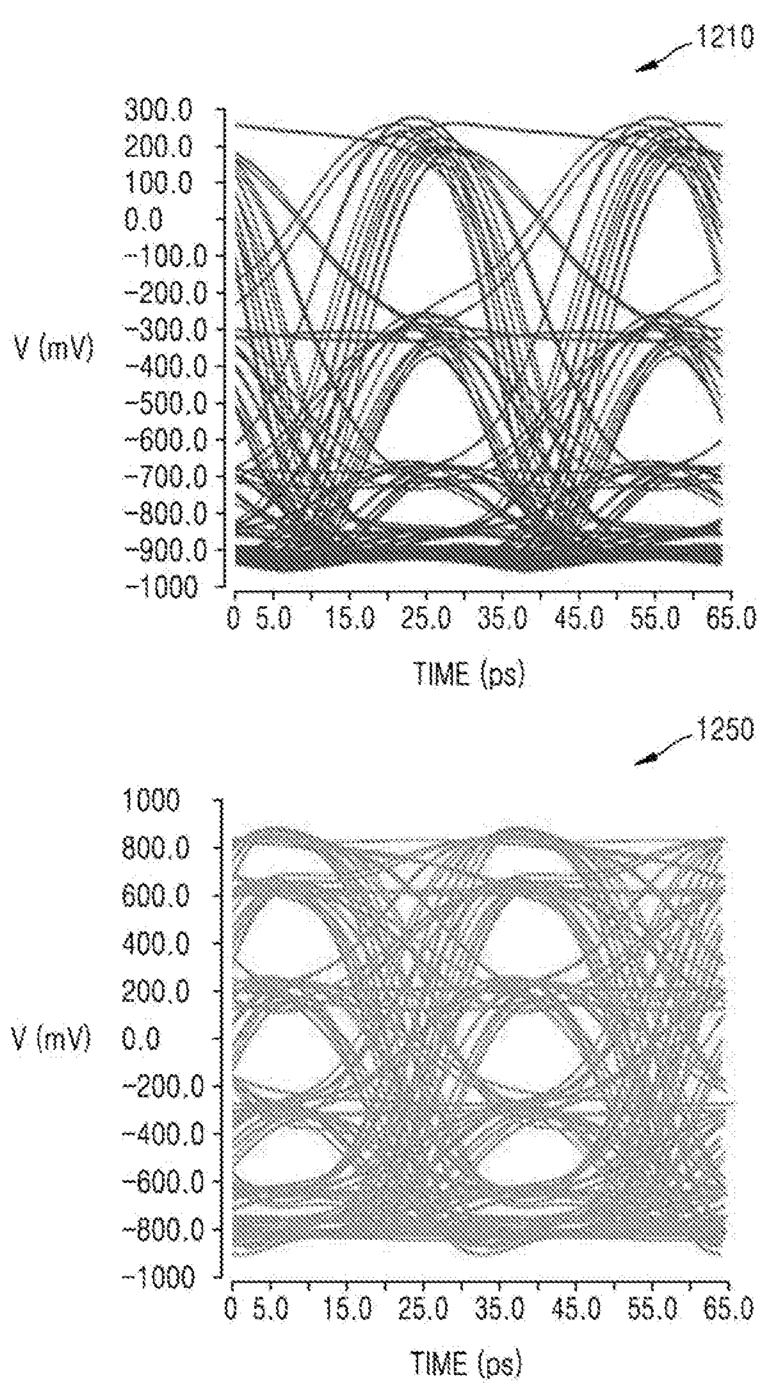
FIG. 12 is an eye diagram of a signal output from a second-phase high-speed amplifier circuit when a differential signal obtained by performing a level-down operation in a first-phase high-speed amplifier circuit is input to the second-phase high-speed amplifier circuit, according to an embodiment.

FIG. 12 is an eye diagram of a signal output from a second-phase high-speed amplifier circuit when a differential signal obtained by performing a level-down operation in a first-phase high-speed amplifier circuit is input to the second-phase high-speed amplifier circuit, according to an embodiment.

In FIG. 12, for convenience of description, a differential signal obtained by performing a level-down operation in the first-phase high-speed amplifier circuit is described as a differential signal 1a. As described above with reference to FIGS. 8 and 9, when the differential signal 1a is input to the second-phase high-speed amplifier circuit, a level-down operation and a level-up operation may be performed on the differential signal 1a.

A first graph 1210 is an eye diagram of a signal output when a level-up operation is performed on the differential signal 1a input to the second-phase high-speed amplifier circuit. As seen in the first graph 1210, a voltage difference between adjacent levels in levels 3 to 5 among all levels of PAM-8 modulation is equal to or higher than a certain value.

A second graph 1250 is an eye diagram of a signal output when a level-down operation is performed on the differential signal 1a input to the second-phase high-speed amplifier circuit. As seen in the second graph 1250, a voltage difference between adjacent levels in levels 5 to 7 among all the levels of the PAM-8 modulation is equal to or higher than a certain value.

Figure 13:
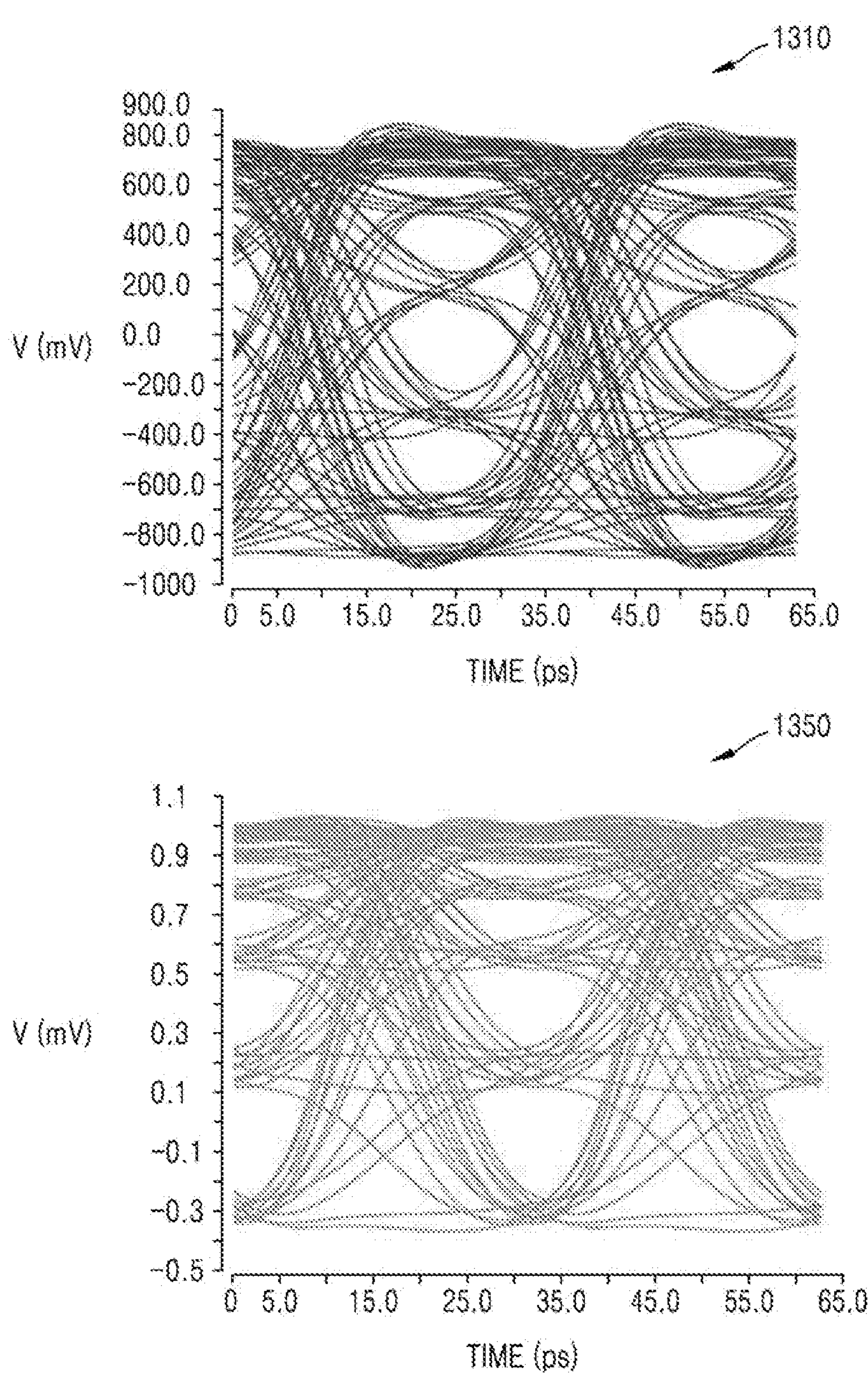
FIG. 13 is an eye diagram of a signal output from a second-phase high-speed amplifier circuit when a differential signal obtained by performing a level-up operation in a first-phase high-speed amplifier circuit is input to the second-phase high-speed amplifier circuit, according to an embodiment.

FIG. 13 is an eye diagram of a signal output from a second-phase high-speed amplifier circuit when a differential signal obtained by performing a level-up operation in a first-phase high-speed amplifier circuit is input to the second-phase high-speed amplifier circuit, according to an embodiment.

In FIG. 13, for convenience of description, a differential signal obtained by performing a level-up operation in the first-phase high-speed amplifier circuit is described as a differential signal 1b. As described above with reference to FIGS. 8 and 9, when the differential signal 1b is input to the second-phase high-speed amplifier circuit, a level-down operation and a level-up operation may be performed on the differential signal 1b.

A first graph 1310 is an eye diagram of a signal output when a level-up operation is performed on the differential signal 1b input to the second-phase high-speed amplifier circuit. As seen in the first graph 1310, a voltage difference between adjacent levels in levels 0 to 2 among all the levels of the PAM-8 modulation is equal to or higher than a certain value.

A second graph 1350 is an eye diagram of a signal output when a level-down operation is performed on the differential signal 1b input to the second-phase high-speed amplifier circuit. As seen in the second graph 1350, a voltage difference between adjacent levels in levels 2 to 4 among all the levels of the PAM-8 modulation is equal to or higher than a certain value.

Figure 14:
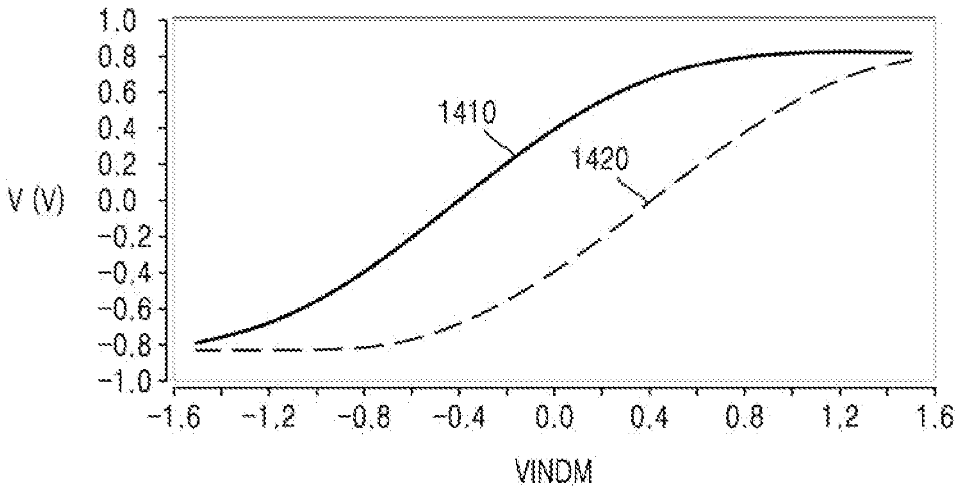
FIG. 14 is a direct current (DC) graph of output signals derived when differential signals on which level conversion is performed are respectively input to continuous-time linear equalizers (CTLEs) in a high-speed amplifier circuit, according to an embodiment.

FIG. 14 is a direct current (DC) graph of output signals derived when differential signals on which level conversion is performed are respectively input to CTLEs in a high-speed amplifier circuit, according to an embodiment.

As seen in an upper graph 1410 of FIG. 14, in the case of a Low CTLE to which a differential signal on which a level-down operation is performed is input, linearity of an output signal is ensured in a range of −900 mV to 200 mV. In addition, as seen in a lower graph 1420, for a High CTLE to which a differential signal on which a level-up operation is performed is input, linearity of an output signal is ensured in a range of −200 mV to 900 mV.

According to an embodiment, the high-speed amplifier circuit may output a signal with ensured linearity characteristics over the entire range of −900 mV to 900 mV by using the Low CTLE and the High CTLE.

A high-speed amplifier circuit according to the disclosure may output a signal with ensured linearity over the entire input signal region by separating regions for a differential input and performing level conversion on the separated regions.

Furthermore, the high-speed amplifier circuit according to the disclosure may ensure linearity of a system even for a signal having a high input voltage swing and a large number of voltage levels, such as a high-order PAM signal. For example, another embodiment may be applied not only to a PAM-8 circuit with eight input levels, but also to a circuit with more than eight input levels or a higher-order PAM circuit.

In addition, the high-speed amplifier circuit according to the disclosure may ensure N times the maximum linearity of a system by adjusting the order of level conversion for separating the responsible regions of an input signal to an Nth order.

A device described above may be implemented as a hardware component, a software component, and/or a combination of the hardware component and the software component.

For example, devices and components described in the embodiments may be implemented by using one or more general-purpose or special-purpose computers, such as a processor, a controller, an arithmetic logic unit (ALU), a digital signal processor, a microcomputer, a field programmable array (FPGA), a programmable logic unit (PLU), a microprocessor, or any other device capable of executing and responding to instructions.

A processing device may an operating system (OS) and one or more software applications running on the OS. Furthermore, the processing device may access, store, manipulate, process, and generate data in response to the execution of software. Although a single processing device may be illustrated for convenience of understanding, one of ordinary skill in the art will understand that the processing device may include a plurality of processing elements and/or a plurality of types of processing elements. For example, the processing device may include a plurality of processors or one processor and one controller. Also, the processing device may have a different processing configuration, such as a parallel processor.

Software may include a computer program, a piece of code, an instruction, or a combination of one or more thereof, and configure a processing device to operate as desired or instruct the processing device independently or collectively. Software and/or data may be permanently or temporarily embodied in any type of machine, components, physical equipment, virtual equipment, computer storage media or units or transmitted signal waves so as to be interpreted by the processing device or to provide instructions or data to the processing device. Software may be distributed over computer systems connected through a network so that software may be stored and executed in a distributed manner. Software and data may be stored on one or more computer-readable recording media.

A method according to an embodiment may be implemented in the form of program commands executable by various types of computers and may be recorded on computer-readable recording media. The computer-readable recording media may include program commands, data files, data structures, etc. either alone or in combination. The program commands recorded on the computer-readable recording media may be designed and configured specially for an embodiment or may be known to and be usable by those of skill in the art of computer software. Examples of the computer-readable recording media include magnetic media such as hard disks, floppy disks, and magnetic tapes, optical media such as compact disk read-only memory (CD-ROM) and digital versatile disks (DVDs), magneto-optical media such as floptical disks, and hardware devices that are specially configured to store and perform program commands, such as ROM, random access memory (RAM), flash memory, etc. Examples of program commands include not only machine code such as that created by a compiler but also high-level language code that may be executed by a computer using an interpreter or the like.

Specific embodiments have been shown and described above. However, the disclosure is not limited to the above-described embodiments, and one of ordinary skill in the art will appreciate that various changes may be readily made therein without departing from the spirit of the technical idea of the disclosure as set forth in the following claims.

According to an embodiment, a high-speed amplifier circuit according to an embodiment of the disclosure may convert a voltage by separating levels for an input differential signal, thereby outputting a signal with ensured linearity over the entire voltage range of the input differential signal.

Furthermore, according to an embodiment, the high-speed amplifier circuit may ensure linearity of a system even for a signal having a high input voltage swing and a large number of voltage levels, such as a high-order PAM signal.

In addition, according to an embodiment, an N-phase high-speed amplifier circuit may achieve up to N times the linearity in a system by performing N phases of voltage level conversion for separating levels for a differential input.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A high-speed amplifier circuit comprising:

a first bias conversion circuit configured to perform a level-down operation on an input positive differential signal;

a second bias conversion circuit configured to perform a level-up operation on an input negative differential signal;

a first transmission circuit electrically connected to the first bias conversion circuit and configured to output a first differential signal having a voltage of a level within a first range among all levels, based on the positive differential signal on which the level-down operation has been performed; and a second transmission circuit electrically connected to the second bias conversion circuit and configured to output a second differential signal having a voltage of a level within a second range among all the levels, based on the negative differential signal on which the level-up operation has been performed.

2. The high-speed amplifier circuit of claim 1, wherein the first transmission circuit comprises a continuous-time linear equalizer (CTLE) configured to output the first differential signal by filtering out inter-symbol interference (ISI) from the positive differential signal on which the level-down operation has been performed, and the second transmission circuit comprises a CTLE configured to output the second differential signal by filtering out ISI from the negative differential signal on which the level-up operation has been performed.

3. The high-speed amplifier circuit of claim 1, wherein the first transmission circuit comprises an amplifier circuit configured to amplify the positive differential signal on which the level-down operation has been performed and output the first differential signal, and the second transmission circuit comprises an amplifier circuit configured to amplify the negative differential signal on which the level-up operation has been performed and output the second differential signal.

4. The high-speed amplifier circuit of claim 1, further comprising:

at least one first slicer configured to determine a level of the output first differential signal; and at least one second slicer configured to determine a level of the output second differential signal.

5. The high-speed amplifier circuit of claim 4, further comprising a plurality of pre-amplifier circuits respectively arranged between the first transmission circuit and the at least one first slicer and between the second transmission circuit and the at least one second slicer.

6. The high-speed amplifier circuit of claim 1, wherein when a total number of levels is L and a number of linearity ensuring levels set in the high-speed amplifier circuit is S, an operation of $R_p$*(S−1)*(2*(L−1)) level-down is performed for a range $R_p$ of the input positive differential signal, and an operation of $R_n$*(S−1)*(2*(L−1)) level-up is performed for a range $R_n$ of the input negative differential signal.

7. The high-speed amplifier circuit of claim 6, further comprising at least one processor configured to determine the number of the linearity ensuring levels, based on the total number L of levels.

8. An N-phase high-speed amplifier circuit comprising a plurality of high-speed amplifier circuits configured to perform N phases of level conversions on a differential signal, wherein each of the plurality of high-speed amplifier circuits comprises:

a first bias conversion circuit;

a second bias conversion circuit;

a first transmission circuit electrically connected to the first bias conversion circuit and configured to output a first differential signal having a voltage of a level within a first range among all levels, based on the differential signal on which a level-down operation is performed by the first bias conversion circuit; and a second transmission circuit electrically connected to the second bias conversion circuit and configured to output a second differential signal having a voltage of a level within a second range among all the levels, based on the differential signal on which a level-up operation is performed by the second bias conversion circuit, and the first differential signal and the second differential signal output from an N-m-1th-phase high-speed amplifier circuit among the plurality of high-speed amplifier circuits are respectively input to a first bias conversion circuit and a second bias conversion circuit of an N-mth-phase high-speed amplifier circuit, where m is an integer of at least 0 but not more than N−2.

9. The N-phase high-speed amplifier circuit of claim 8, wherein the first transmission circuit comprises a continuous-time linear equalizer (CTLE) configured to output the first differential signal by filtering out inter-symbol interference (ISI) from the differential signal on which the level-down operation has been performed, and the second transmission circuit comprises a CTLE configured to output the second differential signal by filtering out ISI from the differential signal on which the level-up operation has been performed.

10. The N-phase high-speed amplifier circuit of claim 8, wherein the first transmission circuit comprises an amplifier circuit configured to amplify the differential signal on which the level-down operation has been performed and output the first differential signal, and the second transmission circuit comprises an amplifier circuit configured to amplify the differential signal on which the level-up operation has been performed and output the second differential signal.

11. The N-phase high-speed amplifier circuit of claim 8, further comprising a plurality of slicers configured to determine a level of a signal output from a high-speed amplifier circuit configured to perform an Nth phase of level conversion from among the plurality of high-speed amplifier circuits.

12. The N-phase high-speed amplifier circuit of claim 11, further comprising a plurality of pre-amplifier circuits respectively arranged between the first transmission circuit and at least one first slicer among the plurality of slicers and between the second transmission circuit and at least one second slicer among the plurality of slicers.

13. The N-phase high-speed amplifier circuit of claim 8, wherein a positive differential signal corresponding to the differential signal is input to a first bias conversion circuit of a first-phase high-speed amplifier circuit among the plurality of high-speed amplifier circuits, and a negative differential signal corresponding to the differential signal is input to a second bias conversion circuit of the first-phase high-speed amplifier circuit among the plurality of high-speed amplifier circuits.

14. The N-phase high-speed amplifier circuit of claim 8, wherein when a total number of levels is L and a number of linearity ensuring levels set in the N-phase high-speed amplifier circuit is S, an operation of $R_1*(S-1)*(2*(L-1))$ level-down is performed for a range $R_1$ of the differential signal input to the first bias conversion circuit, and an operation of $R_2*(S-1)*(2*(L-1))$ level-up is performed for a range $R_2$ of the differential signal input to the second bias conversion circuit.

15. The N-phase high-speed amplifier circuit of claim 14, wherein when the differential signal is a 8-level pulse amplitude modulation (PAM-8) modulated signal, and the plurality of high-speed amplifier circuits perform two phases of level conversion, $R_1$ and $R_2$ of a first-phase high-speed amplifier circuit are set to 5, and $R_1$ and $R_2$ of a second-phase high-speed amplifier circuit are set to 3.

16. The N-phase high-speed amplifier circuit of claim 14, further comprising at least one processor configured to determine the number of the linearity ensuring levels, based on the total number L of levels.

17. An electronic device comprising:

a communication interface;

a plurality of input circuits configured to receive a differential signal from the communication interface;

a high-speed amplifier circuit electrically connected to the plurality of input circuits; and at least one processor configured to apply a preset voltage or current to the high-speed amplifier circuit, wherein the high-speed amplifier circuit comprises:

a first bias conversion circuit configured to perform a level-down operation on a positive differential signal input via a first input circuit among the plurality of input circuits;

a second bias conversion circuit configured to perform a level-up operation on a negative differential signal input via a second input circuit among the plurality of input circuits;

a first transmission circuit electrically connected to the first bias conversion circuit and configured to output a first differential signal having a voltage of a level within a first range among all levels, based on the positive differential signal on which the level-down operation has been performed; and a second transmission circuit electrically connected to the second bias conversion circuit and configured to output a second differential signal having a voltage of a level within a second range among all the levels, based on the negative differential signal on which the level-up operation has been performed.

* * * * *